United States Patent [19]

Komoto

[11] Patent Number: 5,740,086
[45] Date of Patent: Apr. 14, 1998

[54] SEMICONDUCTOR TEST SYSTEM LINKED TO CAD DATA

[75] Inventor: Yoshio Komoto, San Jose, Calif.

[73] Assignee: Advantest Corp., Tokyo, Japan

[21] Appl. No.: 584,112

[22] Filed: Jan. 11, 1996

[51] Int. Cl.$^6$ .................................................. G01R 31/28
[52] U.S. Cl. ...................... 364/580; 364/578; 371/22.1; 371/24; 371/25.1
[58] Field of Search ........................ 364/580, 578; 371/27, 23, 23.1, 22.1, 22.3, 22.5, 24

[56] References Cited

U.S. PATENT DOCUMENTS

| | | | |
|---|---|---|---|
| 5,046,033 | 9/1991 | Andreasen et al. | 364/580 |
| 5,329,471 | 7/1994 | Swoboda et al. | 364/578 |
| 5,425,036 | 6/1995 | Liu et al. | 371/23 |
| 5,513,188 | 4/1996 | Parker et al. | 371/22.3 |
| 5,539,652 | 7/1996 | Tegethoff | 364/490 |

Primary Examiner—Emanuel T. Voeltz
Assistant Examiner—Patrick Assouad
Attorney, Agent, or Firm—Muramatsu & Associates

[57] ABSTRACT

A semiconductor test system for testing a semiconductor device by directly using CAD data produced for the design of the semiconductor device. The test system for applying test signals to the semiconductor device for each reference period and comparing the resulting output signal from the device under test with expected data includes: means for extracting, from CAD design data for the semiconductor device, information on terminals of the semiconductor device and waveform changes in a test vector applied to the semiconductor device, and obtaining terminal data, waveform change data, and data indicating the time of the waveform change; an event memory for storing event data indicating existence of waveform changes in the test vector with respect to the data indicating the terminals; a delay data memory for storing delay time data indicating the time when the waveform change arises as a time difference from the reference period; a waveform data memory for storing waveform data indicating the waveform change when there is a change in the waveform; means for providing address signals to each of the memories at the reference period; and a time delay circuit for adding the delay time to an output signal, read out from the event memory at the reference period, based on the delay data read out from the delay data memory.

5 Claims, 4 Drawing Sheets

SEMICONDUCTOR TEST SYSTEM LINKED TO CAD DATA

FIELD OF THE INVENTION

This invention relates to a semiconductor test system for testing semiconductor devices such as IC devices, and more particularly, to a semiconductor test system for testing semiconductor devices by test signals (test vectors) directly produced by design data which has been made during the design stage of the semiconductor devices on a computer of a CAD design system.

BACKGROUND OF THE INVENTION

In a semiconductor test system for testing a semiconductor device, a test signal pattern called a test vector is provided to the semiconductor device and the resulting output signal from the semiconductor device under test is compared with expected data to determine whether the semiconductor device performs correctly. Generally, test vectors are produced through test programs, however, the languages of the test programs are unique to semiconductor test systems among different manufacturers. Further, hardware structures in the semiconductor test systems vary among the manufacturers.

Recently, it becomes a common practice to design a complicated semiconductor device, such as a custom LSI circuit, through a CAD system including a computer. Generally, such a semiconductor design by a CAD system is performed by the process shown in FIG. 1. First, at a step 11, a function of each circuit element in a semiconductor device is described by a hardware description language whereby design data 12 of the semiconductor device is obtained. Next, at a step 13, a test bench is described by a hardware description language whereby test bench data 14 is obtained. Here, a test bench is a program formed by the hardware description language to perform an imaginary test for a semiconductor device on a computer before actually producing the semiconductor device. HDL is a representative language of the hardware description language, and VHDL and Verilog are know to be formed based on HDL.

In a step 15, a test vector for the imaginary test is formed whereby test vector data 16 is obtained. Unlike the description of the function of the circuit element or the description of the test bench in the foregoing, the test vector is formed through the use of a simulator or a step by step approach by an operator. Further, since the test vector needs a very large amount of information, the completion of the test vector requires complicated and long works. At a step 17, with the used of the test bench and the test vector, the imaginary test is proceeded for the designed semiconductor device on the computer and the test result is analyzed at a step 18. The test result is accumulated as resulted data 22 which is used to evaluate and analyze the semiconductor device design.

FIG. 2 is a schematic diagram showing the imaginary test on the computer before the actual production of the semiconductor device. Test data from an input part 25 is applied to semiconductor device design data 26 (imaginary semiconductor device under test) and resulting outputs of the semiconductor device 26 are compared at a result comparison part 27. The input part 25 for providing the test data and the result comparison part 27 for receiving the outputs from the semiconductor are described by the hardware description language, such as VHDL, and are called the test bench as noted above.

The input part 25 of the test bench determines which input data, as test signals, should be applied to which input pins of the semiconductor device 26. The result comparison part 27 of the test bench determines output data of which output pins of the semiconductor device 26 should be compared with which expected data and whether the result of the comparison is acceptable.

The test vector 28 provides the test signals and the expected data to the test bench considering all of the circuit components and circuit structure of the semiconductor device 26. The test signals and the expected data are called the test vector as noted above. In the imaginary test on the computer of the CAD design system, as will be described in more detail later, the test vector of an event driven format is used.

When the semiconductor devices designed by the computer system are actually put into production, a semiconductor test system tests the actual semiconductor devices. In such a situation, it is ideal to commonly use the test bench and the test vector produced by the CAD system during the design stage of the semiconductor devices in the semiconductor test system as well since it extremely improves a test efficiency. This is because a process for separately making test signal patterns or expected data patterns for the semiconductor test system can be reduced or obviated. However, at present, there is no semiconductor test system which can directly receive the test bench and test vector produced by the CAD system.

Although methods for supplying a test bench and a test vector to a semiconductor test system with the use of a conversion program have been developed, functions of such methods are not sufficient to realize a flexible connection between the CAD data and the semiconductor test system. For example, in such a method, in testing the actually produced semiconductor devices by a semiconductor test system, a test program including test signals and expected data are formed by another language based on the CAD test data. However, such a program conversion requires a large scale hardware and software.

Further, semiconductor systems have different hardware structures from maker to maker. Thus, in case where a test vector is reproduced based on the CAD data for a specific hardware of a semiconductor test system, such test vector cannot be compatible with other semiconductor test systems of different manufacturers. Furthermore, as noted above, since the process for forming a test vector requires long and complicated works, it is inefficient to prepare a test vector for a specific hardware.

As in the foregoing, in the conventional semiconductor test system, the CAD data obtained in the design stage of the semiconductor devices is not able to sufficiently utilize in the testing of the semiconductor devices produced.

SUMMARY OF THE INVENTION

It is therefore an object of the present invention to provide a semiconductor test system which is capable of directly using the CAD data obtained through a CAD system in the design stage of semiconductor devices to test the semiconductor devices which have been actually produced after the design stage.

It is another object of the present invention to provide a semiconductor test system which is capable of using a test bench written by a hardware description language and a test vector in an event driven format, produced through a design stage of semiconductor devices by a CAD system, without complicated works or a large scale hardware and software associated with a conventional technology.

In the present invention, the semiconductor test system for testing a semiconductor device by applying test signals to the semiconductor device under test for each reference period and comparing the resulting output signal from the device under test with expected data, includes:

means for extracting, from CAD design data for the semiconductor device under test, information on predetermined terminals of semiconductor device under test and waveform changes in a test vector applied to the semiconductor device under test, and obtaining terminal data, waveform change data, and data indicating the time of the waveform change;

an event memory for storing event data indicating existence of waveform changes in the test vector with respect to the terminal data;

a delay data memory for storing delay time data indicating the time when the waveform change arises which is expressed as a time difference from the reference period;

a waveform data memory for storing waveform data indicating the waveform change when there arises a change in the waveform;

means for providing address signals to each of the memories at the reference period; and a time delay circuit for adding the delay time to an output signal read out from the event memory at the reference period, based on the delay data read out from the delay data memory.

According to the semiconductor test system of the present invention, it is possible to test the semiconductor devices actually produced after the design stage by directly using the CAD data obtained through the CAD system in the design stage of the semiconductor devices. Further, in the semiconductor test system of the present invention, it is possible to test the actually produced semiconductor devices by using the test bench written by a hardware description language and the test vector in an event drive format obtained through the design stage of semiconductor devices by the CAD system without complicated works or a large scale hardware and software associated with the conventional technology.

DETAILED DESCRIPTION OF THE PREFERRED EMBODIMENT

Figure 3:
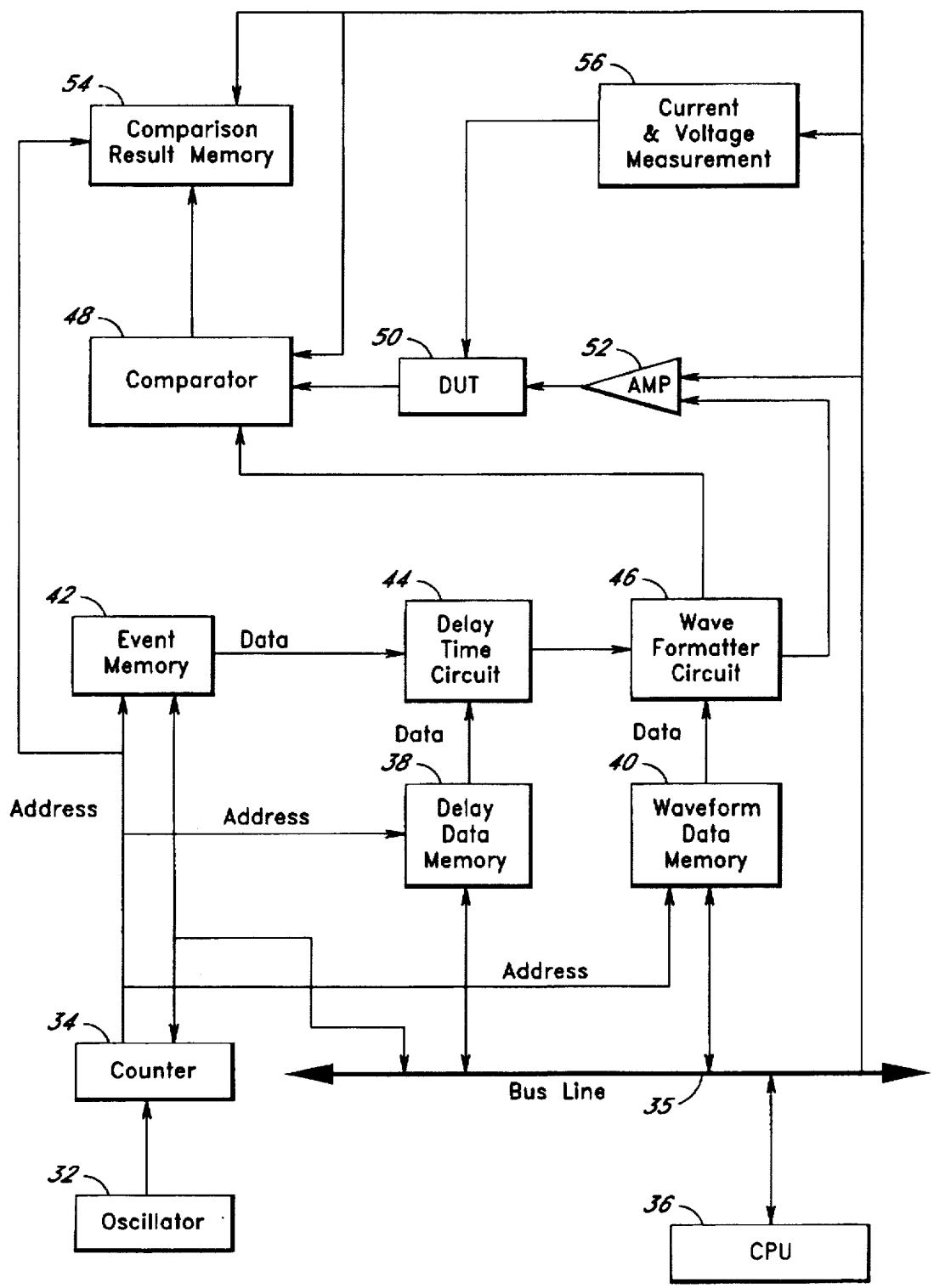
FIG. 3 is a block diagram showing a structure of a semiconductor test system of the present invention.

The semiconductor test system of the present invention tests the semiconductor devices actually manufactured based on the CAD design system by using a test bench written by a hardware description language and a test vector of an event driven format obtained through the design stage of the semiconductor devices by the CAD system. FIG. 3 shows an embodiment of semiconductor test system of the present invention.

Figure 5:
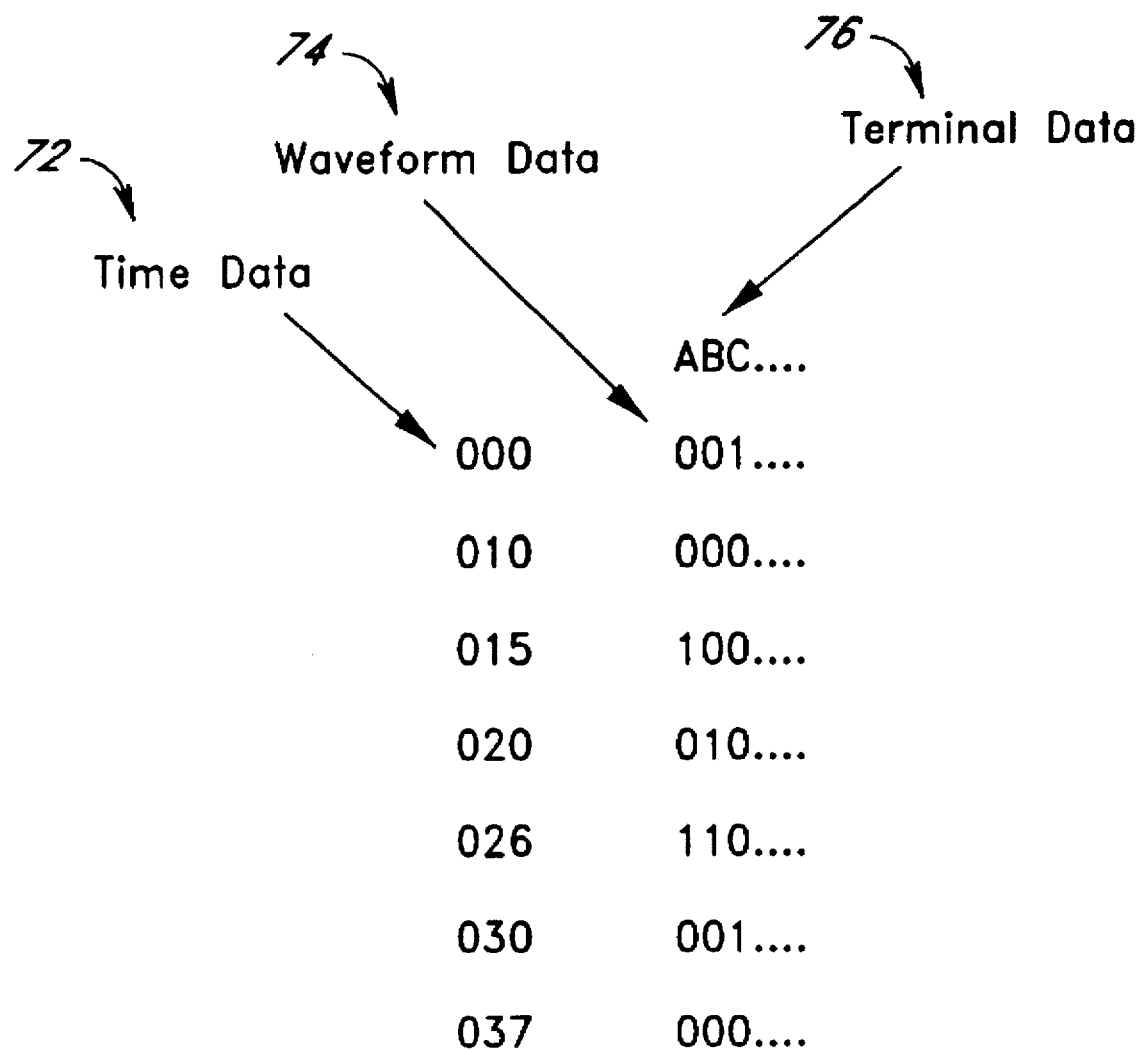
FIG. 5 is a schematic diagram for explaining a test vector having an event driven format which is widely used in CAD systems.

Generally, in a semiconductor design CAD system, a test vector having an event driven format is used. FIG. 5 is a schematic diagram for explaining such an event driven format test vector. Semiconductor terminal data 76 shows each terminal A, B, C . . . of the semiconductor device designed by the CAD system.

Time data 72 and waveform data 74 show waveforms at corresponding times at each of the terminals A, B and C. The time data in this case is designated by nanosecond and indicates a time when the waveform data 74 changes (event) from the previous state. Namely, this example shows the waveform changes (events) arise in response to the basic constant period of 10 nanosecond and the other waveform changes (events) arise between the constant period. For example, the changes in the waveform data have occurred at 15 nanosecond, 26 nanosecond and 37 nanosecond, respectively.

The reason of the waveform changes (events) noted above which are not in the timings of the basic constant period are used is that the test vector is formed in considering signal propagation delay times determined by physical layout and other conditions of the semiconductor elements designed by the CAD system. By considering the probable signal delay times in the design by the computer, it is considered that the imaginary test of the semiconductor device can be performed in a situation more closer to the actual device operation.

Therefore, in the CAD system, the test vector is formed based on events occurred in an irregular manner though a simulator and such a test vector is called an event driven test vector. In contrast, in a semiconductor test system, a test vector is formed based on an operational cycle of a constant time period and such a test vector is called a cycle driven test vector. Thus, it is necessary to have means to directly utilize the event driven test vector in the semiconductor test system using the cycle drive test vector. This invention is to provide such means for a semiconductor test system.

The structure of the semiconductor test system of the present invention is shown in FIG. 3. In this example, the semiconductor test system includes an oscillator 32, a counter 34, a computer 36, a delay data memory 38, a waveform data memory 40, an event memory 42, a time delay circuit 44, a wave-formatter circuit 46, a comparator 48, an amplifier 52, a comparison result memory 54, and a DC measurement circuit 56, to test a semiconductor device 50 under test. The computer 36 controls the overall operation of the semiconductor test system and is connected to each block of the semiconductor test system through a bus line 35.

In the above configuration, the oscillator 32, the counter 34, the wave-formatter circuit 46, the comparator 48, the amplifier 52, the comparison result memory 54, and the DC measurement circuit 56 are basically the same as in the conventional semiconductor test system. The wave-formatter circuit 46 wave-shapes the test signal to a predetermined waveform (RZ waveform, NRZ waveform or EOR waveform, etc.) and sends the test signals to the amplifier 52. The amplifier 52 provides the test signals to the semiconductor device 50 after setting the amplitude and rise times of the test signals. The comparator 48 compares the output signal from the semiconductor device under test 50 resulted by the test signals. The result data from the comparator 48 is stored in the comparison result memory 54. The DC measurement circuit 56 is a circuit for measuring a current/voltage characteristics and an insulation characteristics of the semiconductor device 50. This basic structure and operation of the semiconductor test system is the same as the conventional test system.

The oscillator 32 generates a reference clock which is provided to the counter 34. The counter 34 increments by the reference clock and its output is provided to the event memory 42, the delay data memory 38, the waveform data memory 40 and the comparison result memory 54, as the address signals for these memories. The reference clock has a constant period, for example, 10 nanosecond.

Prior to the test, the event memory 42, the delay data memory 38, the waveform data memory 40 are provided with necessary data from the computer 36 through the bus line 35. This is performed by a software shown in FIG. 4 in which the test vector of the event driven format in the CAD data is examined by the software. When the events (waveform changes) are found in synchronism with the basic constant period or between such constant period, the existence of each event is stored in the event memory 42. Similarly, the delay time of the event with reference to the basic period is stored in the delay time memory 48 and the waveform change at that time is stored in the waveform memory 46.

After transferring all the test vector to the semiconductor test system, the counter 34 is incremented by the reference clock to generate a test vector using the data stored in each of the memories. The output data from the event memory 42 showing the existence of events is provided to the time delay circuit 44 wherein it is delayed by the time indicated by the output data from the delay data memory 38. In the waveformatter 46, the test signal is wave-formatted by the data from the waveform memory 40 showing the change of state in the test vector. The output of the wave-formatter 46 is supplied to the semiconductor device under test 50 through the amplifier 52. As in the following procedure, the actually produced semiconductor device is tested to see whether the semiconductor device functions as intended in the design data.

In the following, it is described an example of procedure in which a semiconductor device is tested by the semiconductor test system of the present invention by transferring the event driven test vector of FIG. 5.

At every 10 nanosecond, changes in the terminal data are extracted as events and such data is transferred to the event memory 42 in the hardware of the semiconductor test system. In the example of FIG. 5, in addition to the events arise at the 10 nanosecond reference operational period, other events also arise in the intermediate of the reference period, which are also transferred to the event memory 42.

The events occurred in the intermediate of the reference period of 10 nanosecond, such as 15 nanosecond, 26 nanosecond, 37 nanosecond, are expressed by the delay times from the immediately prior reference period and transferred to delay data memory 38. For example, the event of 15 nanosecond is expressed as a 5 nanosecond delay from the 10 nanosecond reference period and such data is transferred to the delay data memory 38.

These events in the test vector are transferred to the waveform data memory 40. In the preferred embodiment, such an event is expressed by a plurality of bits such as "001" when the data is changed from 0 to 1, and by "010" when the data is changed from 1 to 0. By storing waveform data of multi-bits like this in the waveform memory 40, the waveform change can be expressed by characters, and thus it is convenient in a process such as a failure analysis of the semiconductor devices.

After transferring all the data of the test vector, the counter 34 operates with 10 nanosecond interval to count up the addresses for the memories. As a consequence, even when the reference clock period is fixed to 10 nanosecond, all the events including the events existing between the 10 nanosecond period can be supplied as test signals to the semiconductor device 50 under test. Thus, the semiconductor test system of the present invention tests the semiconductor devices manufactured based on the CAD design system by directly generating test signals with the use of a test bench written by a hardware description language and a test vector in an event drive format obtained through the design stage of semiconductor devices by the CAD system.

Figure 1:
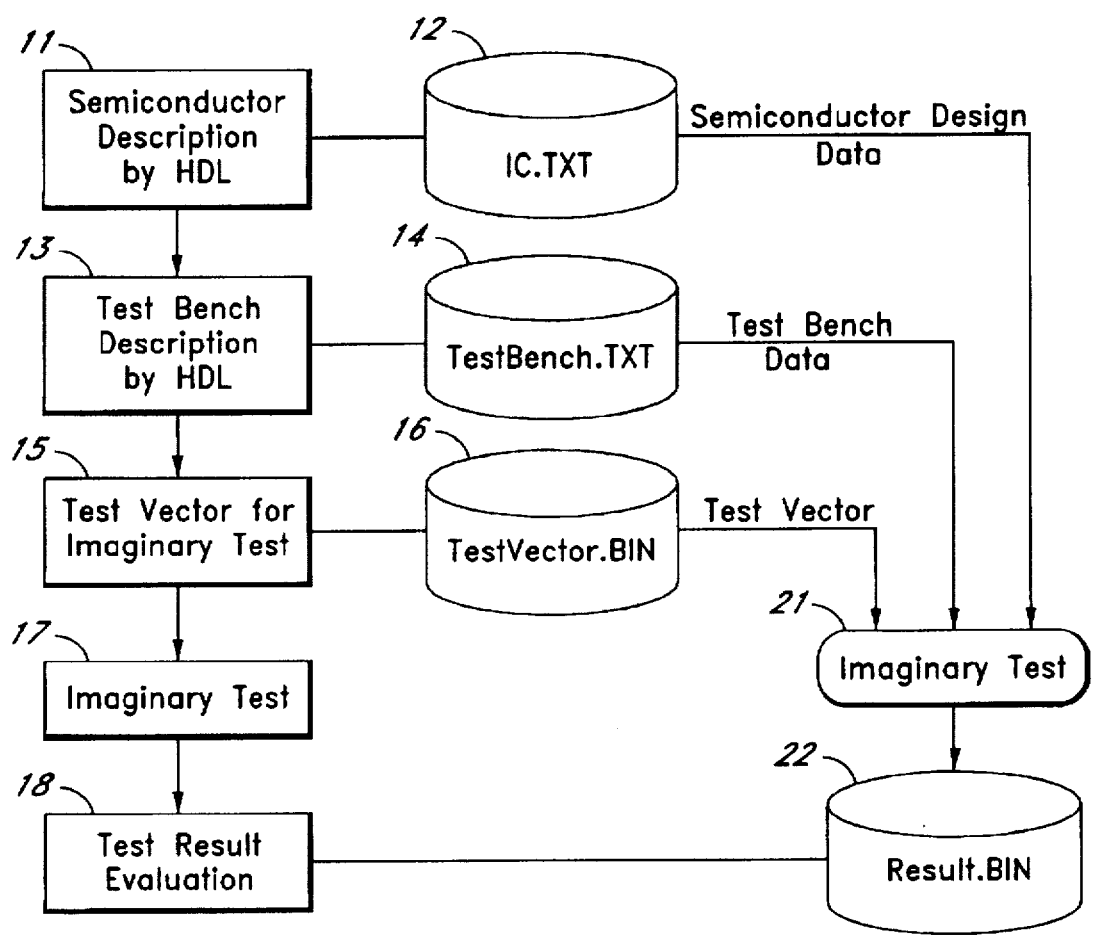
FIG. 1 shows a general procedure for designing semiconductor devices through a CAD system and CAD data obtained by this procedure.
Figure 2:
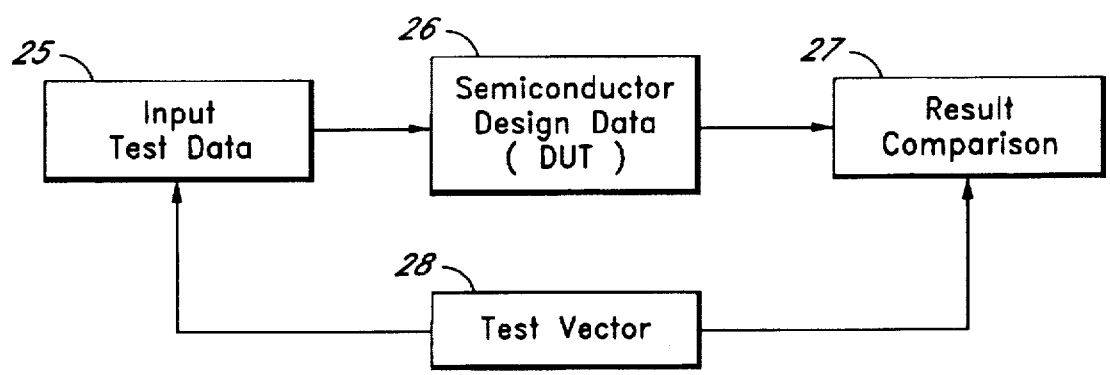
FIG. 2 is a schematic diagram showing a preliminary test for an imaginary semiconductor device designed on a computer through a CAD system.
Figure 4:
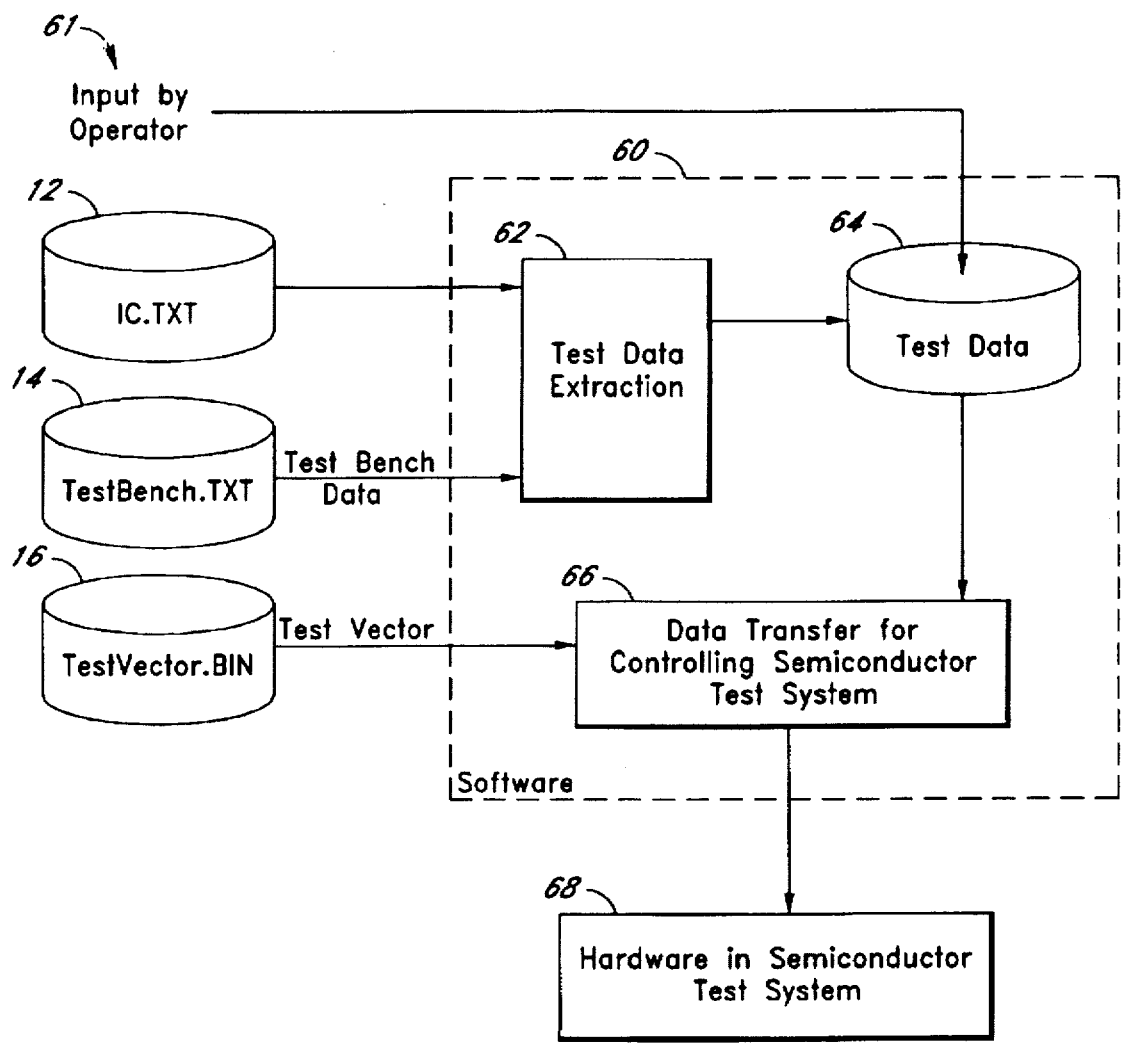
FIG. 4 is a schematic diagram of a software structure for providing data to control the semiconductor test system of the present invention.

FIG. 4 shows a schematic diagram showing a software of the present invention for supply data to the semiconductor test system to control the test system. The design data of the semiconductor device as shown in FIG. 1 is given to a software 60 of the present invention. As noted above, the design data includes the design data 12 of circuit components, the test bench data 14, and the test vector 16. Further, data 61 showing test conditions defined by an operator can also be applied to the software 60. This is to supplementally provides additional test conditions to the test system in case where the test conditions obtained by the design data 12 and the test bench 14 are not sufficient to test the actually manufactured semiconductor device.

At a test condition extracting step 62, the software 60 produces test data 64 by extracting the test conditions from the semiconductor component design data 12 and the test bench data 14. The test data 64 includes data of various circuit components in the semiconductor device under test 50 and terminal data to supply test signals to the components. Based on the test data, it is determined as to what test signals should be applied to which terminal of the semiconductor device under test 50, and resulting outputs of which terminal should be compared with which expected data. At a data transfer step 66, the test data 64, as well as the test vector 16, are transferred to a tester hardware 68 which includes the delay data memory 38, the waveform data memory 40 and the event memory 42 of the semiconductor test system. The test vector 16 includes data for the test signals and expected data used in the test bench 14.

As has been foregoing, according to the semiconductor test system of the present invention, it is possible to test the semiconductor devices actually produced after the design stage by directly using the CAD data obtained through the CAD system in the design stage of the semiconductor devices. Further, in the semiconductor test system of the present invention, it is possible to test the actually produced semiconductor devices by using the test bench written by a hardware description language and the test vector in an event drive format obtained through the design stage of semiconductor devices by the CAD system without complicated works or a large scale hardware and software associated with the conventional technology.

What is claimed is:

1. A semiconductor test system for testing a semiconductor device by applying test signals to the semiconductor device under test for each reference clock period and comparing the resulting output signal from the device under test with expected data, comprising:

means for extracting, from CAD design data for the semiconductor device under test, design information on predetermined terminals of a semiconductor device under test and waveform changes in a test vector to be applied to the semiconductor device under test, said extracting means including means for converting time data in said CAD design data with respect to said waveform changes which is asynchronous with said reference clock period of said semiconductor test system to delay time data expressed relative to said reference clock period;

an event memory for storing event data indicating existence of said waveform changes within said reference clock period in the test vector extracted from said CAD design data with respect to the data indicating the terminals of said semiconductor device under test;

a delay data memory for storing said delay time data from said extracting means indicating the time delay of said waveform changes expressed as time differences from said reference clock period;

a waveform data memory for storing waveform data indicating a type of waveform with respect to each of said waveform changes;

means for providing address signals to each of the memories at said reference clock period; and a time delay circuit for adding the delay time to an output signal read out from the event memory at said reference clock period, based on the delay time data read out from the delay data memory.

2. A semiconductor test system as defined in claim 1, wherein said extracting means is formed of a software which determines the event data, delay data and waveform data corresponding to each terminal of the semiconductor device under test based on semiconductor component design data, test bench data and test vector of the semiconductor device under test with the use of the design data obtained through the CAD system.

3. A semiconductor test system as defined in claim 1, further includes a wave formatter circuit for wave shaping a signal from the time delay circuit based on the waveform data provided from the waveform memory.

4. A semiconductor test system as defined in claim 1, wherein the test vector included in the design data is structured by an event driven format.

5. A semiconductor test system as defined in claim 1, wherein the software includes an input means which allows additional test conditions defined by an operator.

* * * * *